United States Patent
Tsuji

(10) Patent No.: US 9,548,330 B2
(45) Date of Patent: Jan. 17, 2017

(54) METHOD FOR PRODUCING SEMICONDUCTOR LIGHT RECEIVING DEVICE AND SEMICONDUCTOR LIGHT RECEIVING DEVICE

(71) Applicant: SUMITOMO ELECTRIC INDUSTRIES, LTD., Osaka (JP)

(72) Inventor: Yukihiro Tsuji, Kawasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/962,793

(22) Filed: Dec. 8, 2015

(65) Prior Publication Data

US 2016/0172411 A1 Jun. 16, 2016

(30) Foreign Application Priority Data

Dec. 10, 2014 (JP) ................. 2014-249999

(51) Int. Cl.
*H01L 27/146* (2006.01)

(52) U.S. Cl.
CPC ... *H01L 27/14643* (2013.01); *H01L 27/14607* (2013.01); *H01L 27/14692* (2013.01); *H01L 27/14694* (2013.01)

(58) Field of Classification Search
CPC .... B81B 7/007; B81C 1/0023; B81C 1/00301; B81C 1/00904; H01L 21/561; H01L 23/5389; H01L 23/552; H01L 24/19; H01L 24/96; H01L 24/97; H01L 25/105; H01L 25/50; H01L 27/14607; H01L 27/14643; H01L 27/14692; H01L 27/14694

See application file for complete search history.

(56) References Cited

U.S. PATENT DOCUMENTS

| 6,625,195 B1 * | 9/2003 | Henrichs ............. H01S 5/18341 372/96 |
| 2003/0185266 A1 * | 10/2003 | Henrichs ............. H01S 5/18358 372/96 |

(Continued)

FOREIGN PATENT DOCUMENTS

WO 2011-089949 7/2011

OTHER PUBLICATIONS

Office Action issued Jul. 14, 2016 in U.S. Appl. No. 14/962,707.

*Primary Examiner* — Allan R Wilson
(74) *Attorney, Agent, or Firm* — Smith, Gambrell & Russell, LLP.

(57) ABSTRACT

A method for producing a semiconductor light receiving device includes the steps of growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately; forming a mask on the stacked semiconductor layer; forming a mesa structure on the substrate by etching the stacked semiconductor layer using the mask so as to form a substrate product, the mesa structure having a side surface exposed in an atmosphere; forming a fluorinated amorphous layer on the side surface of the mesa structure by exposing the substrate product in fluorine plasma; and after the step of forming the fluorinated amorphous layer, forming a passivation film containing an oxide on the side surface of the mesa structure.

9 Claims, 8 Drawing Sheets

(56) References Cited

U.S. PATENT DOCUMENTS

2008/0254203 A1    10/2008   Zhou
2009/0165839 A1*   7/2009   Zeman .................. B82Y 20/00
                                                                                                       136/244
2014/0197373 A1    7/2014   Iguchi
2016/0172530 A1*   6/2016   Tsuji .................... H01L 31/184
                                                                                                        438/94

\* cited by examiner

METHOD FOR PRODUCING SEMICONDUCTOR LIGHT RECEIVING DEVICE AND SEMICONDUCTOR LIGHT RECEIVING DEVICE

BACKGROUND OF THE INVENTION

1. Field of the Invention

The present invention relates to a method for producing a semiconductor light receiving device and a semiconductor light receiving device.

2. Description of the Related Art

International Publication No. WO2011-089949 discloses a compound semiconductor photodiode array. The photodiode array is combined with a silicon read-out integrated circuit (ROIC) to constitute a photodetector module.

Image sensors include, for example, a photodiode array that includes a plurality of photodiodes. Such a photodiode array is classified into a planar-type photodiode array and a mesa-type photodiode array. In the mesa-type photodiode array, pixels are arranged at higher density as compared with the planar-type photodiode array. By arranging pixels at high density, a high-resolution image sensor is produced. In image sensors including a mesa-type photodiode array, each of the photodiodes includes a mesa structure. In addition, the mesa structure includes an optical absorption layer having a super-lattice structure, for example. The super-lattice structure included in the optical absorption layer is exposed in an atmosphere at a side surface of the mesa structure. In general, the exposed side surface of the mesa structure is covered with a passivation film to protect the side surface of the mesa structure.

SUMMARY OF THE INVENTION

However, it was found that the mesa-type photodiode including a super-lattice structure in the optical absorption layer has a relatively large dark current that is generated at an interface between the super-lattice structure and the passivation film formed on the side surface of the mesa structure. Such a dark current is measured as a current flowing between electrodes of the photodiode. The dark current deteriorates the S/N ratio of an image sensor.

The side surface of the mesa structure formed by etching is exposed in the air (atmosphere) until a passivation film is formed on the side surface of the mesa structure. As a result of this exposure, native oxides of constituent elements of semiconductor layers in the super-lattice structure are unintentionally formed on the side surface of the mesa structure. It was also found that the formation of the native oxides generates a dark current at an interface between the passivation film and the side surface of the super-lattice structure.

A method for producing a semiconductor light receiving device according to an aspect of the present invention includes the steps of growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately; forming a mask on the stacked semiconductor layer; forming a mesa structure on the substrate by etching the stacked semiconductor layer using the mask so as to form a substrate product, the mesa structure having a side surface exposed in an atmosphere; forming a fluorinated amorphous layer on the side surface of the mesa structure by exposing the substrate product in fluorine plasma; and after the step of forming the fluorinated amorphous layer, forming a passivation film containing an oxide on the side surface of the mesa structure.

A semiconductor light receiving device according to another aspect of the present invention includes a mesa structure including a light-receiving layer having a super-lattice structure, the super-lattice structure including a first semiconductor layer and a second semiconductor layer that are stacked alternately; a fluorinated amorphous layer on a side surface of the mesa structure; and a passivation film containing an oxide on the side surface of the mesa structure. The first semiconductor layer contains gallium and antimony as a constituent element. The second semiconductor layer contains a material different from a material of the first semiconductor layer. In addition, the fluorinated amorphous layer is provided between the side surface of the mesa structure and the passivation film.

The above object, other objects, features, and advantages of the present invention are more easily understood from the following detailed description of preferred embodiments of the present invention, the description being made with reference to the attached drawings.

DESCRIPTION OF THE PREFERRED EMBODIMENTS

Figure 1A:
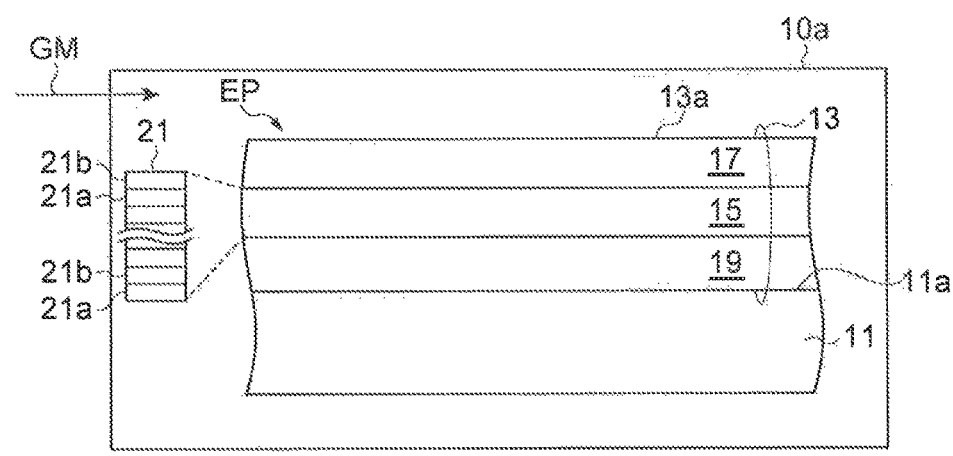
FIGS. 1A and 1B schematically illustrate main steps in a method for producing a semiconductor light receiving device according to the embodiment.

Some embodiments will be described below.

A method for producing a semiconductor light receiving device according to an embodiment includes the steps of (a) growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately; (b) forming a mask on the stacked semiconductor layer; (c) forming a mesa structure on the substrate by etching the stacked semiconductor layer using the mask so as to form a substrate product, the mesa structure having a side surface exposed in an atmosphere; (d) forming a fluorinated amorphous layer on the side surface of the mesa structure by exposing the substrate product in fluorine plasma; and (e) after the step of forming the fluorinated amorphous layer, forming a passivation film containing an oxide on the side surface of the mesa structure.

In the method for producing a semiconductor light receiving device, the fluoride layer including the fluorinated amorphous layer is disposed on the side surface of the super-lattice structure in the light-receiving layer in the mesa structure. Before the formation of the fluoride layer, an oxide including a constituent element of the first and second semiconductor layers in the super-lattice structure is formed on the side surface of the mesa structure. The passivation film is formed on the fluoride layer after the formation of the fluoride layer. The passivation film is in contact with the fluoride layer. From the viewpoint of electronegativity of fluorine, a dark current does not easily flow through an interface between the passivation film and the fluoride layer compared with an interface between the passivation film and the semiconductor layers in the super-lattice structure in the mesa structure.

As described above, the oxide on the side surface of the super-lattice structure in the mesa structure contains a compound of oxygen and a constituent element of the first and second semiconductor layers in the super-lattice structure. When the fluoride layer is formed on the oxide, an oxygen atom in the oxide is dissociated, and the constituent element without a bond with the oxygen atom bonds to fluorine so as to form the fluorinated amorphous layer. By forming the fluoride layer on the oxide, the amount of the oxide on the side surface of the super-lattice structure is reduced. This also reduces the dark current of the mesa-type photodiode in the semiconductor light receiving device.

In the method for producing a semiconductor light receiving device, the first semiconductor layer preferably contains gallium and antimony as a constituent element, and the second semiconductor layer contains a material different from a material of the first semiconductor layer.

The method for producing a semiconductor light receiving device may further include a step of oxidizing the side surface of the mesa structure so as to form an oxide including a constituent element of at least one of the first and second semiconductor layers in the super-lattice structure between the steps of forming the mesa structure and forming the fluorinated amorphous layer.

In the method for producing a semiconductor light receiving device, the fluorine plasma is preferably generated using a fluorine raw material including carbon fluoride or sulfur fluoride.

In the method for producing a semiconductor light receiving device, the passivation film may contain a silicon dioxide.

In the method for producing a semiconductor light receiving device, preferably, the first semiconductor layer of the super-lattice structure is made of GaSb, and the second semiconductor layer of the super-lattice structure is made of InAs.

A semiconductor light receiving device according to another embodiment includes a mesa structure including a light-receiving layer having a super-lattice structure, the super-lattice structure including a first semiconductor layer and a second semiconductor layer that are stacked alternately; a fluorinated amorphous layer on a side surface of the mesa structure; and a passivation film containing an oxide on the side surface of the mesa structure. The first semiconductor layer contains gallium and antimony as a constituent element. The second semiconductor layer contains a material different from a material of the first semiconductor layer. In addition, the fluorinated amorphous layer is provided between the side surface of the mesa structure and the passivation film.

According to the semiconductor light receiving device, the fluoride layer including the fluorinated amorphous layer is disposed between the side surface of the super-lattice structure in the mesa structure and the passivation film. The passivation film is in contact with the fluoride layer. In the semiconductor light receiving device according to the embodiment, a dark current flowing through an interface between the passivation film and the fluoride layer disposed on the mesa structure is suppressed.

In the semiconductor light receiving device, the passivation film may contain a silicon dioxide.

In the semiconductor light receiving device, preferably, the first semiconductor layer of the super-lattice structure is made of GaSb, and the second semiconductor layer of the super-lattice structure is made of InAs.

The findings of the present invention can be easily understood from the following detailed description with reference to the attached drawings shown as an example. An embodiment of the method for producing a semiconductor light receiving device will be described with reference to the attached drawings. The same parts are designated by the same reference numerals where applicable.

FIG. 1A to FIG. 4 schematically illustrate main steps in the method for producing a semiconductor light receiving device according to this embodiment. First, a substrate 11 to grow semiconductor layers thereon is prepared. The substrate 11 is placed in a growth chamber 10a. As illustrated in FIG. 1A, a stacked semiconductor layer 13 for forming a semiconductor light receiving device is epitaxially grown on a principal surface 11a of the substrate 11 by supplying a raw material GM in the growth chamber 10a. The substrate 11 is made of, for example, GaSb, InP, InSb, or GaAs. The stacked semiconductor layer 13 is grown by using a molecular beam epitaxial growth (MBE) method or a metal-organic vapor phase epitaxy (MOVPE) method, for example. The stacked semiconductor layer 13 includes a semiconductor layer 15 and a first-conductivity-type semiconductor layer 17 disposed on the semiconductor layer 15. The semiconductor layer 15 includes a light-receiving layer in which a photo-current is generated by absorption of light. The first-conductivity-type semiconductor layer 17 is made of a III-V group compound semiconductor. The stacked semiconductor layer 13 may optionally include a second-conductivity-type semiconductor layer 19 made of a III-V group compound semiconductor between the semiconductor layer 15 and the substrate 11. The conductivity type of the first-conductivity-type semiconductor layer 17 is opposite to the conductivity type of the second-conductivity-type semiconductor layer 19. When the substrate 11 is made of conductive semiconductor material, the stacked semiconductor layer 13 does not necessarily include the second-conductivity-type semiconductor layer 19. The semiconductor layer 15 includes, for example, a super-lattice structure 21. The super-lattice structure 21 includes first semiconductor layers 21a and second semiconductor layers 21b that are alternately stacked on top of each other. The first semiconductor layers 21a contain gallium and antimony as constituent elements. The second semiconductor layers 21b are made of a material different from the material of the first semiconductor layer 21a. The super-lattice structure 21 includes, for example, a GaSb/InAs super-lattice. Through these processes, an epitaxial wafer EP is produced. This epitaxial wafer EP includes the substrate 11 and the stacked semiconductor layer 13 grown on the substrate 11.

Example of epitaxial wafer EP
Substrate 11: p-type GaSb substrate
First-conductivity-type semiconductor layer 17: InAs
Super-lattice structure 21 in semiconductor layer 15:
  number of repetitions: 100 layers to 500 layers
    First semiconductor layer 21a: GaSb (thickness 1 nm to 5 nm)
    Second semiconductor layer 21b: InAs (thickness 1 nm to 5 nm)
Second-conductivity-type semiconductor layer 19: GaSb
The super-lattice structure 21 is not limited to the above-described combination of GaSb/InAs. The super-lattice structure 21 may include InGaAs/GaAsSb super-lattice, for example. The stacked semiconductor layer 13 has a thickness of, for example, 3 μm to 7 μm.

Figure 1B:
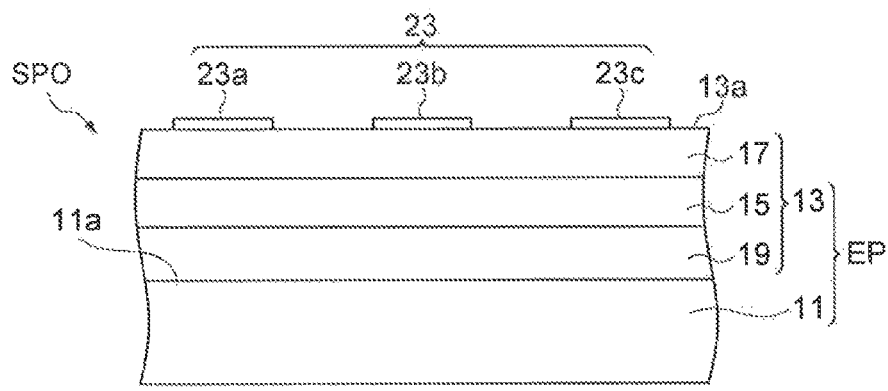

The epitaxial wafer EP is taken out of the growth chamber 10a, and then a mask for forming mesa structures is formed on the stacked semiconductor layer 13. First, an insulating layer is formed on a principal surface 13a of the stacked semiconductor layer 13. The insulating layer is formed by using a chemical vapor deposition (CVD) method, In this embodiment, the insulating layer is made of silicon nitride (SiN). The insulating layer has a thickness of, for example, 100 nm to 500 nm. By using a photolithography method and an etching method, the insulating layer is patterned so as to form a mask 23 as illustrated in FIG. 1B. The mask 23 is used as an etching mask to form semiconductor mesas. The mask 23 has a one-dimensional pattern or a two-dimensional pattern (23a, 23b, and 23c) in accordance with the arrangement of the mesa structures. The mask 23 is made of a material for the insulating layer, such as silicon nitride (SiN). A substrate product SP0 is produced in this process. The substrate product SP0 includes the epitaxial wafer EP and the mask 23 formed on the epitaxial wafer EP.

Figure 2A:
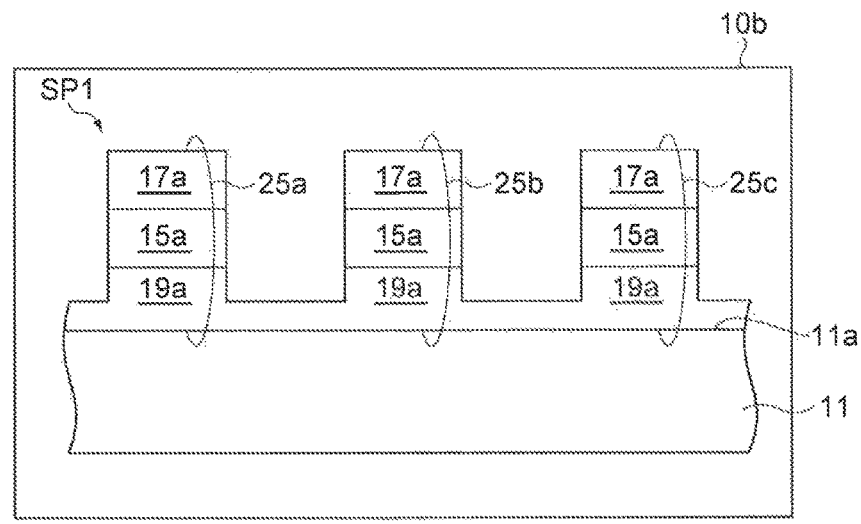
FIGS. 2A and 2B schematically illustrate main steps in the method for producing a semiconductor light receiving device according to the embodiment.

After the formation of the mask 23, the substrate product SP0 is placed in an etching apparatus 10b. As illustrated in FIG. 2A, the epitaxial wafer EP is etched using the mask 23 as the etching mask to form a substrate product SP1. The super-lattice structure 21 of the semiconductor layer 15 is etched by, for example, dry etching or wet etching. In the dry etching process, an inductively coupled plasma reactive ion etching (ICP RIE) method is used, for example. In the ICP RIE method, a halogen gas (for example, $Cl_2$, $BCl_3$, $HI$, or $SiCl_4$) or a mixed gas containing a hydrocarbon gas (for example, methane gas) and a hydrogen gas is used as an etching gas, for example. When the wet etching is applied, for example, a citric acid base etchant is used.

Referring to FIG. 2A, the substrate product SP1 includes mesa structures 25a, 25b, and 25c formed from the stacked semiconductor layer 13. In the embodiment, the mesa structures 25a, 25b, and 25c are formed by etching the stacked semiconductor layer 13 with using the dry etching method. The mesa structures 25a, 25b, and 25c correspond to the patterns 23a, 23b, and 23c of the mask 23, respectively. Each of the mesa structures 25a, 25b, and 25c includes a first-conductivity-type semiconductor layer 17a formed from the first-conductivity-type semiconductor layer 17, a light-receiving layer 15a formed from the semiconductor layer 15, and a second-conductivity-type semiconductor layer 19a formed from the second-conductivity-type semiconductor layer 19. The light-receiving layer 15a includes the super-lattice structure 21 and is disposed between the first-conductivity-type semiconductor layer 17a and the second-conductivity-type semiconductor layer 19a. Each of the mesa structures 25a, 25b, and 25c has a height dependent on the thickness of the stacked semiconductor layer 13. The height of each of the mesa structures 25a, 25b, and 25c is, for example, 1 to 5 μm.

In this embodiment, the bottom of each of the mesa structures 25a to 25c is located in the middle of the second-conductivity-type semiconductor layer 19 of the stacked semiconductor layer 13. When necessary, the bottom of each of the mesa structures 25a to 25c is located inside the substrate 11.

The substrate product SP1 is taken out of the etching apparatus 10b and then the mask 23 is removed. For example, a buffered hydrofluoric acid is used to remove the mask 23 made of silicon nitride. After the removal of the mask 23, side surfaces and top surfaces of the mesa structures 25a to 25c are exposed in the air (atmosphere).

FIGS. 5A to 5D schematically illustrate a cross-section of the super-lattice structure 21 of the light-receiving layer 15a in the mesa structure. In FIGS. 5A to 5D, the four steps from the pretreatment step to the passivation forming step are illustrated.

Figure 2B:
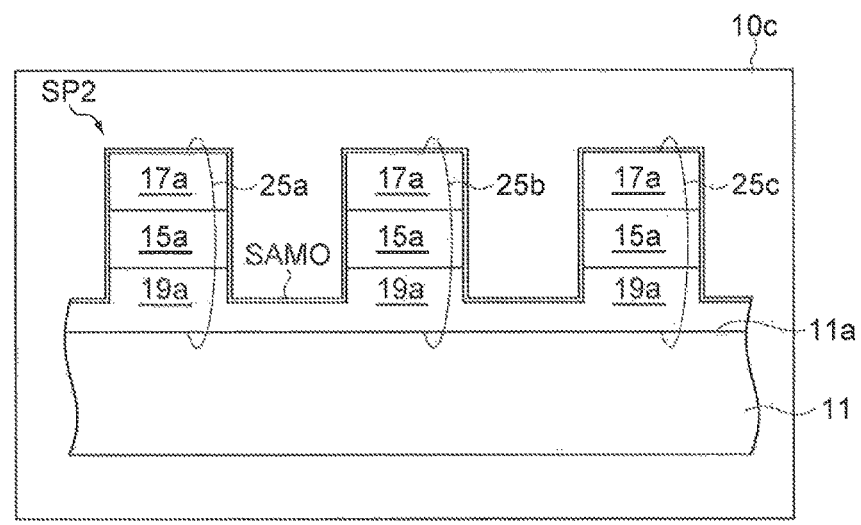
Figure 5A:
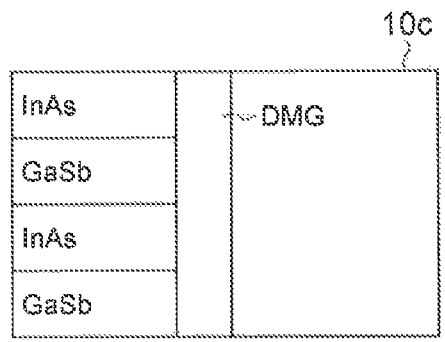
FIGS. 5A to 5D schematically illustrate the side surface of a super-lattice structure of a light-receiving layer in main steps from a pretreatment step to a passivation film formation step in the method for producing a semiconductor light receiving device according to the embodiment.
Figure 5B:
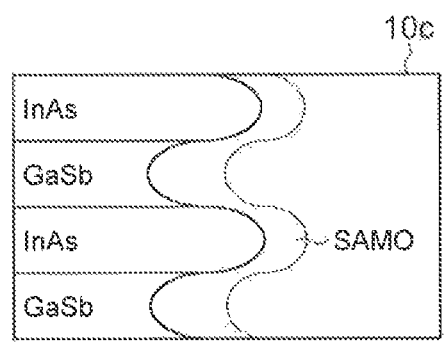
Figure 5C:
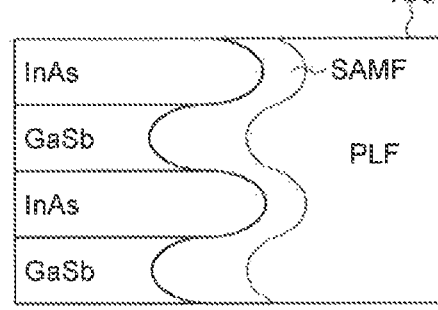

After forming the substrate product SP1 by etching the stacked semiconductor layer 13, a damaged layer DMG is left on the side surface of the mesa structure, as illustrated in FIG. 5A. The substrate product SP1 is placed in a treatment apparatus 10c. For example, the following treatment is performed on the substrate product SP1 in the treatment apparatus 10c, as illustrated in FIG. 2B. First, the damaged layer formed on the side surface of the mesa structure of the substrate product SP1 is removed. This pretreatment step includes an etching step and a water rinse step. In the process of removing the damaged layer DMG by etching, a mixed solution of phosphoric acid, hydrogen peroxide, and water is used, for example. The mixing ratio of the mixed solution is, for example, phosphoric acid/hydrogen peroxide/water=1/2/20. The substrate product SP1 is immersed in the mixed solution, and then the substrate product SP1 is rinsed with ultrapure water. The rinse with ultrapure water is performed for, for example, 5 to 10 minutes, After the rinse with ultrapure water, an amorphous layer SAMO is formed on the side surface of the super-lattice structure 21 in the mesa structure of the substrate product SP1 as illustrated in FIG. 5B. The amorphous layer SAMO contains elements constituting the super-lattice structure 21, such as gallium (Ga), arsenic (As), antimony (Sb), or indium (In). The amorphous layer SAMO also contains a compound (for example, gallium oxide) of oxygen and one of the constituent elements (for example, gallium) of the super-lattice structure 21. The ultrapure water slightly contains oxygen (for example, 5 to 10 ppb).

In the water rinse step, therefore, the side surfaces of the mesa structures 25a to 25c that are exposed after the removal of the damaged layer DMG are oxidized. Thus, the amorphous layer SAMO contains an oxide of a III group constituent element or a V group constituent element of the first and second semiconductor layers 21a, 21b in the super-lattice structure 21.

The constituent elements of the super-lattice structure 21 have oxidizing properties different from each other. Referring to FIG. 5B, on the side surface of the super-lattice structure 21, each layer constituting the super-lattice structure has a characteristic structure in accordance with the oxidation tendency of the constituent elements. The amorphous layer SAMO having a thickness of about 5 to 10 nm is preferably formed by controlling the pretreatment time (for example, rinsing time). Through these pretreatment processes, a substrate product SP2 is produced from the substrate product SP1. After the removal of the damaged layer DMG, the amorphous layer SAMO is formed on the side surface of the super-lattice structure 21 in the mesa structure. The amorphous layer SAMO formed on the side surface of the super-lattice structure 21 is exposed in the air (atmosphere).

Figure 3A:
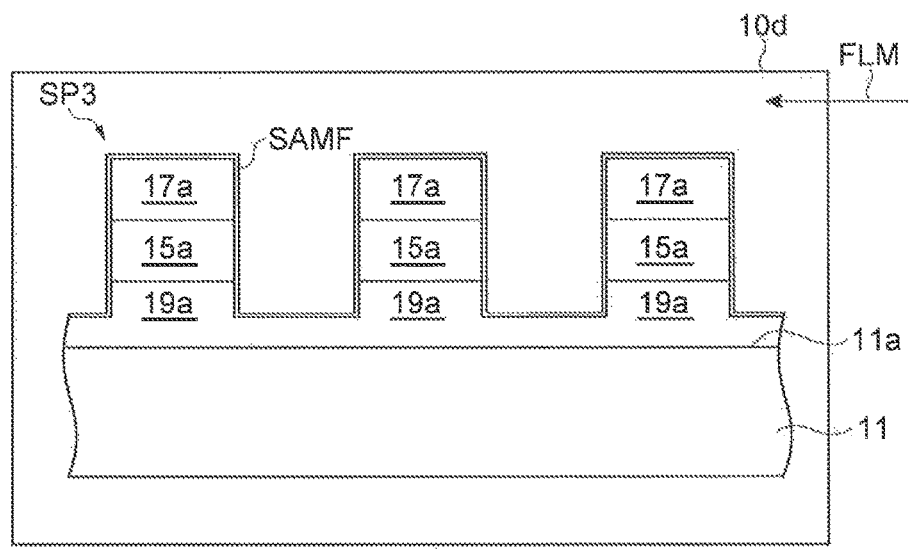
FIGS. 3A and 3B schematically illustrate main steps in the method for producing a semiconductor light receiving device according to the embodiment.

After the removal of the damaged layer DMG, as illustrated in FIG. 3A, the substrate product SP2 is placed in a plasma treatment apparatus 10d (fluorinating step). In the embodiment, a fluorine raw material FLM is supplied in the plasma treatment apparatus 10d. A fluorine plasma PLF containing fluorine radicals or fluorine ions is generated from the fluorine raw material FLM. The fluorine plasma PLF is applied on a surface of the amorphous layer SAMO of the substrate product SP2. By applying the fluorine plasma PLF, a part of or the entire oxygen in the amorphous layer SAMO is replaced with fluorine. Thus, as illustrated in FIG. 3A, a fluorinated amorphous layer SAMF is formed on the side surfaces of the mesa structures in the substrate product SP2. The fluorinated amorphous layer SAMF is also formed on the top surfaces of the mesa structures when the amorphous layer SAMO is formed on the top surfaces of the mesa structures. Consequently, a substrate product SP3 is produced from the substrate product SP2.

In the embodiment, the fluorine raw material FLM includes carbon fluoride or sulfur fluoride, for example. The use of the carbon fluoride and/or the sulfur fluoride as a fluorine raw material generates the fluorine plasma PLF. Typically, the fluorine plasma PLF is formed by using at least one of fluorocarbon gases such as $CF_4$, $C_2F_6$, and $CHF_3$ and $SF_6$. For example, when the plasma is formed by using a $CF_4$, gas, an inductively coupled plasma (ICP) apparatus including two RF power sources (ICP RF power source and bias RF power source) is used as a plasma source. An example of conditions for forming the fluorine plasma PLF with the $CF_4$ gas in the ICP apparatus will be described below.

Flow rate of $CF_4$: 150 sccm
Pressure in chamber: 1.0 pascals
ICP RF power source output: 300 watts (frequency: 13.56 MHz)
Plasma treatment time: 100 seconds
The stage temperature (substrate temperature) is set to be 25° C.

In the embodiment, a bias RF power is not applied. Since the bias RF power is not applied, the amount of ions drawn onto the substrate product is decreased. Therefore, the damage of a surface of the substrate product, which is caused by an ion collision, is reduced.

Between the water rinse step and the fluorinating step, the side surface of the mesa structure may be oxidized using an $O_2$ plasma in the ICP apparatus.

Example of $O_2$ plasma conditions
Pressure in chamber: 1.0 pascals
ICP RF power source output: 100 watts
Bias RF power source output: 100 watts
Flow rate of $O_2$:10 sccm
Plasma treatment time: 30 seconds
The stage temperature (substrate temperature) is set to be 25° C.

The fluorinating step will be described in detail. In the fluorinating step, the oxide formed on the side surface of the semiconductor mesa is fluorinated in the fluorine plasma PLF. The fluorine plasma PLF is generated so as to satisfy the conditions in which oxygen is dissociated from the oxide. Because the electronegativity of fluorine (F) is higher than that of oxygen (O), fluorine has a higher bond energy than that of oxygen. Therefore, oxygen is dissociated from a metal oxide including a constituent element such as gallium, indium, antimony, and arsenic of the semiconductor layers in the super-lattice structure 21. Simultaneously, the constituent element without a bond with the oxygen atom in the metal oxide bonds to fluorine so as to form the fluorinated amorphous layer SAMF on the side surfaces of the mesa structures in the substrate product SP2. On the other hand, the oxygen dissociated from the metal oxide bonds to carbon so as to form gaseous carbon dioxide ($CO_2$), which is discharged from the apparatus.

Figure 3B:
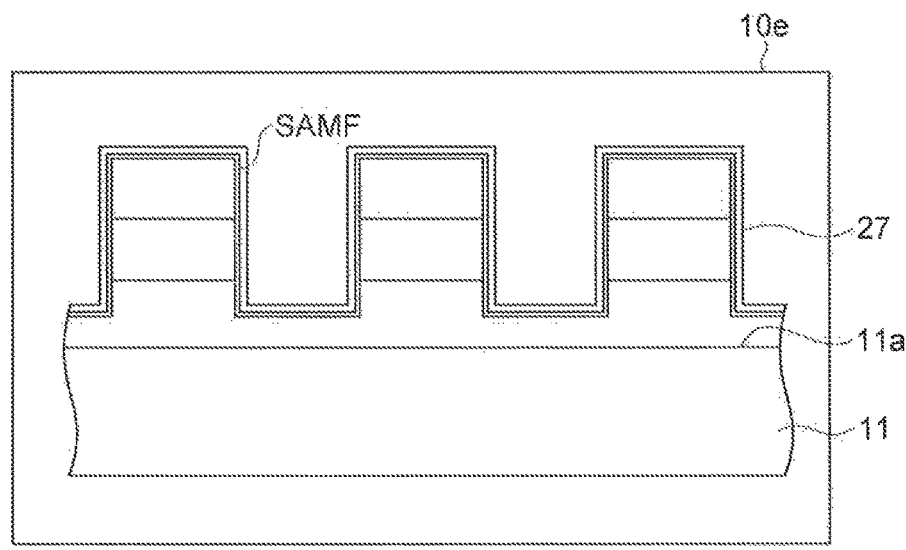

After the fluorinated amorphous layer SAMF is formed on the side surfaces of the mesa structures, a passivation film 27 is formed on the fluorinated amorphous layer SAMF in a film formation apparatus 10e as illustrated in FIG. 3B. The passivation film 27 includes an oxide layer made of silicon dioxide, silicon oxy-nitride, or aluminum oxide. The passivation film 27 has a thickness of for example, 300 nm to 500 nm. For example, silane and nitrous oxide are used as raw material gases to form the passivation film 27. The film formation apparatus 10e is, for example, a capacitively-coupled plasma CVD apparatus or a microwave plasma CVD apparatus.

Figure 5D:
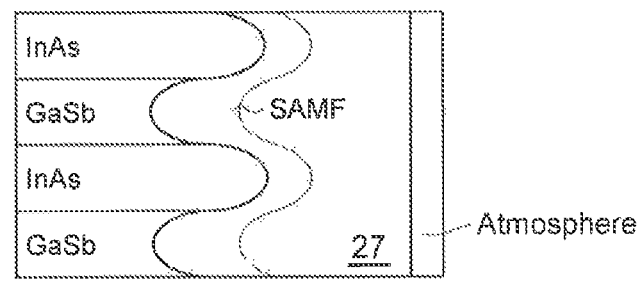

Referring to FIG. 5D, the passivation film 27 is formed on the fluorinated amorphous layer SAMF. In this embodiment, the passivation film 27 is made of silicon dioxide ($SiO_2$). The passivation film 27 may made of silicon oxy-nitride or aluminum oxide.

For example, a silicon dioxide ($SiO_2$) film is formed by using a plasma-enhanced CVD (PE-CVD) method. The film formation temperature is, for example, 150° C. The fluorinated amorphous layer SAMF is thermally stable. Therefore, the fluorinated amorphous layer SAMF is not altered during the deposition of the passivation film 27. The fluorinated amorphous layer SAMF functions as a barrier against an oxidation source (for example, oxygen radical) during the formation of the passivation film 27. Thus, an oxidation source such as an oxygen radical is prevented from directly contacting the side surface of the super-lattice structure 21 in the mesa structure. The semiconductor layer exposed at the side surface of the super-lattice structure 21 in the mesa structure is also suppressed from oxidation during the formation of the $SiO_2$ film.

In the step of forming the mesa structures 25a to 25c, an oxide is unintentionally formed on the side surfaces of the semiconductor layers (21a and 21b) in the super-lattice structure 21 because the side surfaces of the semiconductor layers (21a and 21b) are exposed in the air (atmosphere). The oxide contains a compound of oxygen and the constituent elements of, for example, gallium (Ga) element, arsenic (As) element, antimony (Sb) element, or indium (In) element in the semiconductor layers (21a and 21b). If a large amount of the oxide is left in the amorphous layer formed between the passivation film 27 and the side surface of the super-lattice structure 21 in each of the mesa structures 25a to 25c, a dark current is generated in the semiconductor light receiving device.

The amount of the oxide (oxide of the constituent element of the semiconductor layers (21a and 21b)) formed on the side surface of the super-lattice structure 21 is reduced by processing the substrate product SP2 in the fluorine plasma PLF. This reduces a dark current due to the oxide formed on the side surface of the mesa structures.

Figure 4:
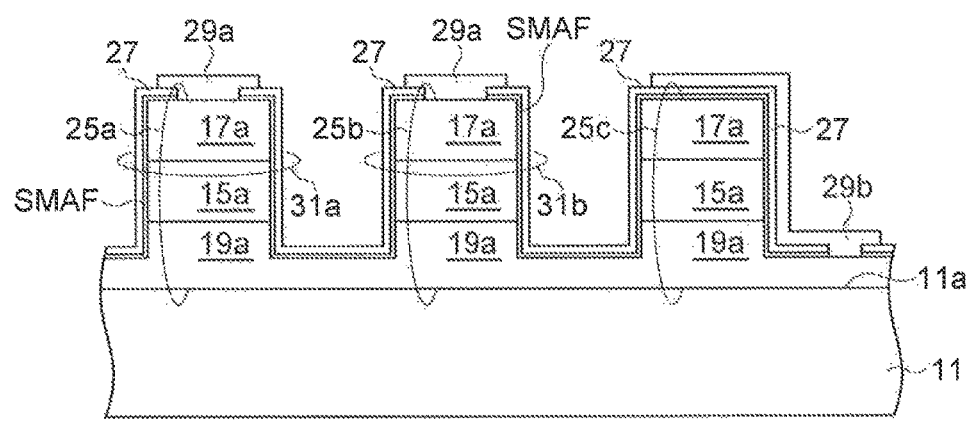
FIG. 4 schematically illustrates a main step in the method for producing a semiconductor light receiving device according to the embodiment.

As illustrated in FIG. 4, after the formation of the passivation film 27, a first opening is formed in the passivation film 27 on the upper surface of each of the mesa structures 25a and 25b by etching the passivation film 27. In the embodiment, the fluorinated amorphous layer SAMF is also formed between the top surface of the mesa structure and the passivation film 27. In this case, when the first opening is formed, the fluorinated amorphous layer SAMF formed on the top surface of the mesa structure is etched so that the top surface of the mesa structure (in the embodiment, the surface of the first-conductivity-type semiconductor layer 17a) is exposed. A first electrode 29a (for example, n-side electrode) of each of photodiodes 31a and 31b is formed in the first opening. The first electrode 29a is made of, for example, Ti/Pt/Au/Ni/Au. The first electrode 29a is formed by, for example, a lift-off method. A second opening is formed in the passivation film 27 on a semiconductor region (for example, on the second-conductivity-type semiconductor layer 19a) different from a region of the substrate on which the mesa structures 25a, 25b, and 25c have been formed. In the embodiment, the fluorinated amorphous layer SAMF is also formed between the top surface of the semiconductor region and the passivation film 27. In this case, when the second opening is formed, the fluorinated amorphous layer SAMF formed on the top surface of the semiconductor region is etched so that the top surface of the semiconductor region (in the embodiment, the surface of the second-conductivity-type semiconductor layer 19a) is exposed. A second electrode 29b (for example, p-side electrode) of the photodiodes 31a and 31b is formed in the second opening. The second electrode 29b extends to the upper surface of the mesa structure 25c. The second electrode 29b is made of, for example, Ti/Pt/Au/Ni/Au. The second electrode 29b is formed by, for example, a lift-off method. The first electrode 29a is in ohmic contact with the top surface of the mesa structures 25a and 25b (in the embodiment, the surface of the first-conductivity-type semiconductor layer 17a) exposed through the first opening. The second electrode 29b is in ohmic contact with the top surface of the second-conductivity-type semiconductor layer 19a exposed through the second opening. When the substrate 11 has conductivity, the second electrode 29b may be disposed on the back surface of the substrate.

Figure 6A:
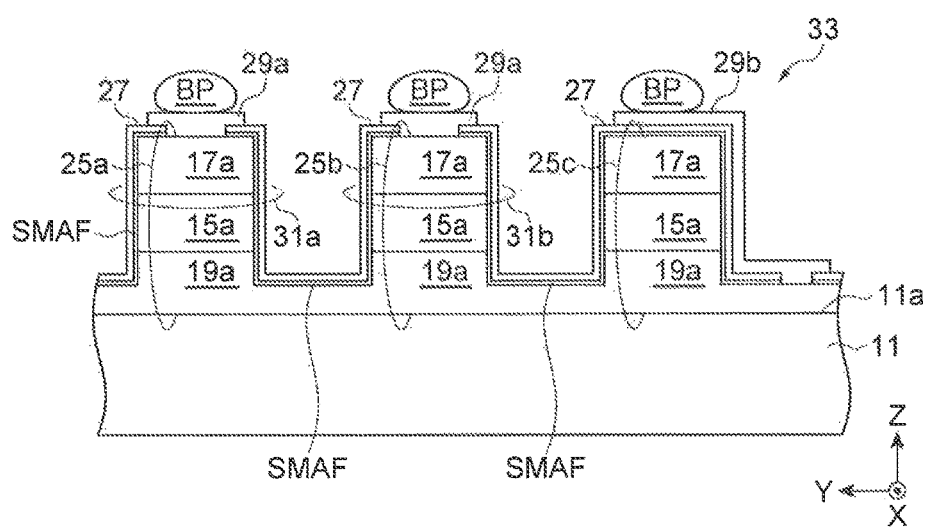
FIGS. 6A and 6B schematically illustrate a semiconductor light receiving device according to the embodiment.
Figure 6B:
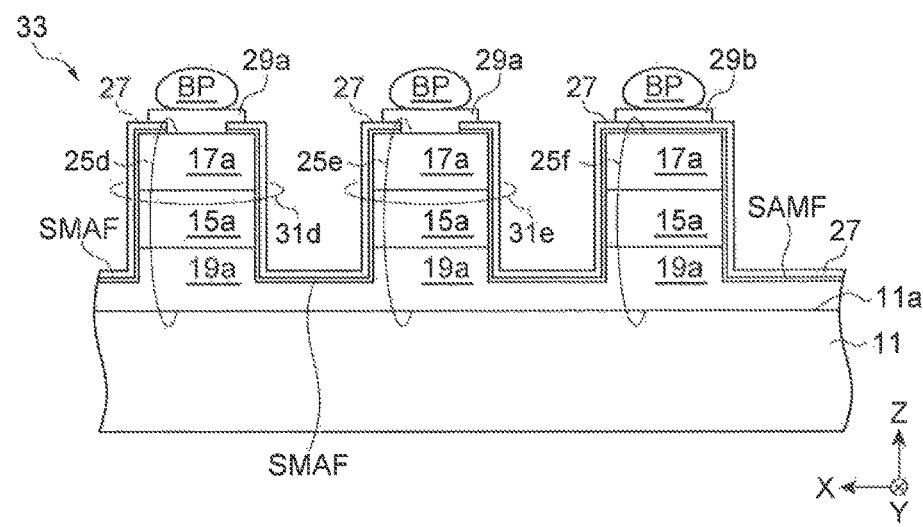

After these processes, a bump electrode BP (for example, indium (In) bump electrode BP) may be optionally formed on the first electrode 29a and the second electrode 29b. The bump electrode BP is formed by, for example, a lift-off method. Subsequently, the substrate product is cut into individual chips by a dicing process. Thus, a semiconductor light receiving device 33 including a photodiode array is produced as illustrated in FIGS. 6A and 6B. The semiconductor light receiving device 33 includes an array of photodiodes 31a, 31b, 31d, and 31e that are two-dimensionally arranged in the X-axis direction and Y-axis direction of the rectangular coordinate system S. The photodiodes 31a, 31b, 31d, and 31e correspond to the mesa structures 25a, 25b, 25d, and 25e, respectively.

The semiconductor light receiving device 33 produced by the above production method includes an array of the photodiodes 31a, 31b, 31d, and 31e, for example. Each of the photodiodes 31a, 31b, 31d, and 31e includes the mesa structure (25a, 25b, 25d, or 25e), the fluorinated amorphous layer SAMF formed on the side surface of the mesa structure, and the passivation film 27 formed on the fluorinated amorphous layer SAMF. Each of the mesa structures (25a, 25b, 25d, and 25e) includes the light-receiving layer 15a and is disposed on a principal surface of the substrate 11. The light-receiving layer 15a has a super-lattice structure 21 illustrated in FIG. 1A. The super-lattice structure 21 includes the first semiconductor layer 21a and the second semiconductor layer 21b that are stacked alternately. The first semiconductor layer 21a contains gallium (Ga) and antimony (Sb) as constituent elements. The second semiconductor layer 21b is made of a material different from a material of the first semiconductor layer 21a. As described above, the super-lattice structure 21 includes a GaSb/InAs super-lattice, for example. A fluoride layer including the fluorinated amorphous layer SAMF is disposed on the side surface of the light-receiving layer 15a in each of the mesa structures (25a, 25b, 25d, and 25e). The passivation film 27 is disposed on the fluorinated amorphous layer SAMF. The passivation film 27 contains an oxide such as silicon dioxide ($SiO_2$). In this semiconductor light receiving device 33, the fluorinated amorphous layer SAMF is disposed between the passivation film 27 and the side surface of the light-receiving layer 15a in each of the mesa structures (25a, 25b, 25d, and 25e). The passivation film 27 is in contact with the fluorinated amorphous layer SAMF. In the photodiode having the mesa structure including the super-lattice structure, a dark current is suppressed by forming the fluorinated amorphous layer SAMF between the side surface of the mesa structure and the passivation film 27. Furthermore, at the interface between the passivation film 27 and the fluorinated amorphous layer SAMF a current leak path is also not formed.

The passivation film 27 made of the oxide (for example, silicon dioxide) contains silicon as a constituent element. According to the semiconductor light receiving device 33, the passivation function of the oxide containing silicon as a constituent element is used. At the interface between the passivation film 27 and the fluorinated amorphous layer SAMF, the bottom of a conduction band in the fluorinated amorphous layer SAMF is shifted upward to the vacuum level in a curved manner in a direction from the fluorinated amorphous layer SAMF to the interface so as to form a potential barrier. Therefore, the transition path of carriers (for example, electrons) is not formed. The fluorinated amorphous layer SAMF has a thickness of about 5 nm to 10 nm. The passivation film 27 has a thickness of about 300 nm to 500 nm.

Figure 7:
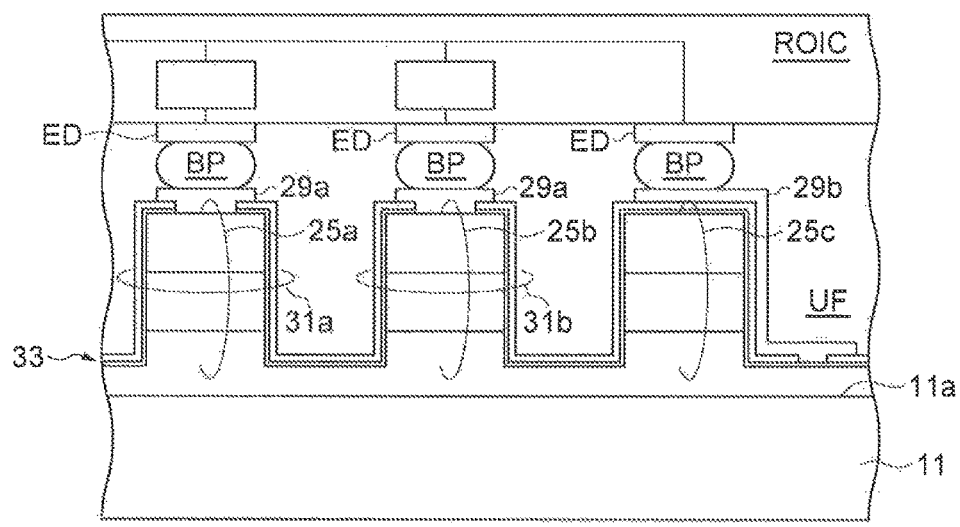
FIG. 7 schematically illustrates an image sensor according to the embodiment.

FIG. 7 schematically illustrates an image sensor according to the embodiment. As illustrated in FIG. 7, the electrodes (29a and 29b) of the semiconductor light receiving device 33 are joined to electrodes ED of a read-out integrated circuit ROIC by using a flip-chip bonding method with the bump electrodes BP therebetween. A gap between the semiconductor light receiving device 33 and the read-out integrated circuit ROIC is filled with an underfill resin UF. Subsequently, the underfill resin UF is cured by heat treatment. In order to suppress the absorption of incident light, polishing or grinding may be optionally performed on the substrate 11 to decrease the thickness of the substrate 11. For example, when the substrate 11 is made of GaSb, the back surface of the substrate is polished or ground to decrease the thickness of the substrate because the GaSb substrate has a large optical absorption for mid-infrared light. Thus, an infrared-incident surface is formed on the back surface of the substrate. The processed GaSb substrate has a thickness of, for example, about 100 μm.

Figure 8A:
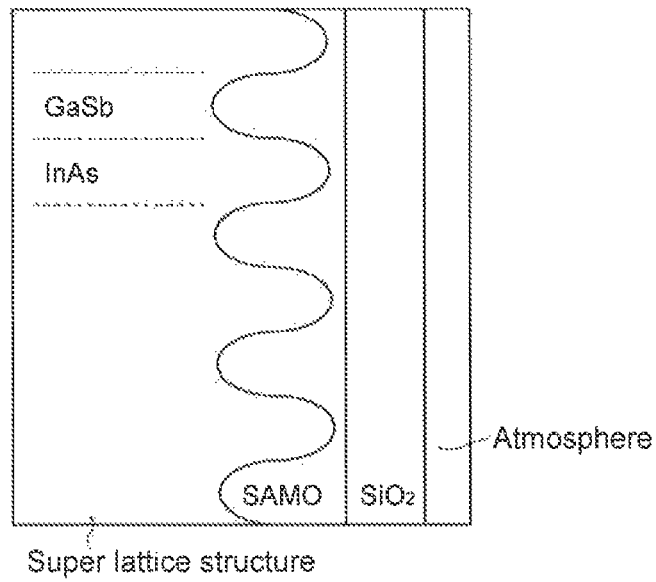
FIGS. 8A and 8B schematically illustrate a passivation structure formed by the method for producing a semiconductor light receiving device according to the embodiment and a passivation structure different from the above passivation structure.
Figure 8B:
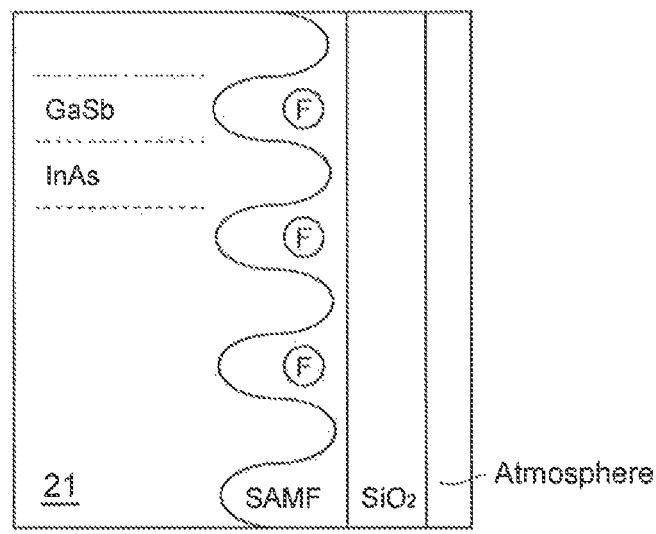

In the process flow of mid-infrared image sensors, the structure of the passivation film is important to reduce a dark current. FIG. 8A schematically illustrates a structure in which the passivation film is directly formed on the side surface of the super-lattice structure in each of the mesa structures. A compound of silicon and oxygen is contained in a semiconductor (in a depressed portion of the amorphous layer corresponding to the position of a GaSb layer in the super-lattice structure) of the structure described in FIG. 8A. When the passivation film (for example, $SiO_2$ film) containing an oxide is formed, the side surface of the super-lattice structure in the mesa structure is exposed in an oxidation source such as oxygen. Herein, the surface of the semiconductor layer is oxidized, and an oxide layer is formed. In the oxide layer, an element (for example, III group element) constituting the semiconductor layers of the super-lattice structure and oxygen are bonded to each other so as to form the oxide including, for example, gallium oxide. Since the semiconductor layer and the oxide layer are in contact with each other, dangling bond and pinning of an energy band easily occur at the boundary portion between the semiconductor layer and the oxide layer. In such a mid-infrared image sensor, a dark current that flows through an interface between the semiconductor layer and the passivation film increases. As illustrated in FIG. 8B, the mid-infrared image sensor in the embodiment includes the semiconductor light receiving device including a plurality of mesa-type photodiodes each of which includes the fluorinated amorphous layer SAMF between the side surface of the super-lattice structure in the mesa structure and the passivation film. Therefore, in the mid-infrared image sensor in the embodiment, a dark current is suppressed as described above.

The method for producing a semiconductor light receiving device according to this embodiment may be applied not only to the mid-infrared image sensor, but also to a light-receiving layer having a type-II multi-quantum well structure (MQW structure) made of InGaAs/GaAsSb and used for near-infrared image sensors.

In preferred embodiments, principles of the present invention have been described with reference to the drawings. However, those skilled in the art understand that the present invention can be changed in arrangement and details without departing from the principles, The present invention is not limited to the specific configurations disclosed in the embodiments. Therefore, the Claims and all the modifications and changes within the spirit of the Claims are claimed as the invention.

What is claimed is:

1. A method for producing a semiconductor light receiving device, the method comprising the steps of:
   growing a stacked semiconductor layer on a principal surface of a substrate, the stacked semiconductor layer including a light-receiving layer having a super-lattice structure, the super-lattice structure including a first semiconductor layer and a second semiconductor layer that are stacked alternately;
   forming a mask on the stacked semiconductor layer;
   forming a mesa structure on the substrate by etching the stacked semiconductor layer using the mask so as to form a substrate product, the mesa structure having a side surface exposed in an atmosphere;
   forming a fluorinated amorphous layer on the side surface of the mesa structure by exposing the substrate product in fluorine plasma; and
   after the step of forming the fluorinated amorphous layer, forming a passivation film containing an oxide on the side surface of the mesa structure.

2. The method for producing a semiconductor light receiving device according to claim 1, wherein the first semiconductor layer contains gallium and antimony as a constituent element, and
   the second semiconductor layer contains a material different from a material of the first semiconductor layer.

3. The method for producing a semiconductor light receiving device according to claim 1, further comprising a step of oxidizing the side surface of the mesa structure so as to form an oxide including a constituent element of at least one of the first and second semiconductor layers in the super-lattice structure between the steps of forming the mesa structure and forming the fluorinated amorphous layer.

4. The method for producing a semiconductor light receiving device according to claim 1, wherein the fluorine plasma is generated using a fluorine raw material including carbon fluoride or sulfur fluoride.

5. The method for producing a semiconductor light receiving device according to claim 1, wherein the passivation film contains a silicon dioxide.

6. The method for producing a semiconductor light receiving device according to claim 1, wherein the first semiconductor layer of the super-lattice structure is made of GaSb, and
   the second semiconductor layer of the super-lattice structure is made of InAs.

7. A semiconductor light receiving device comprising:
   a mesa structure including a light-receiving layer having a super-lattice structure, the super-lattice structure including a first semiconductor layer and a second semiconductor layer that are stacked alternately;
   a fluorinated amorphous layer on a side surface of the mesa structure; and
   a passivation film containing an oxide on the side surface of the mesa structure,
   wherein the first semiconductor layer contains gallium and antimony as a constituent element,
   the second semiconductor layer contains a material different from a material of the first semiconductor layer, and
   the fluorinated amorphous layer is provided between the side surface of the mesa structure and the passivation film.

8. The semiconductor light receiving device according to claim 7, wherein the passivation film contains a silicon dioxide.

9. The semiconductor light receiving device according to claim 7, wherein the first semiconductor layer of the super-lattice structure is made of GaSb, and
   the second semiconductor layer of the super-lattice structure is made of InAs.

* * * * *